United States Patent [19]
Yoshimoto et al.

[11] Patent Number: 5,352,299
[45] Date of Patent: Oct. 4, 1994

[54] THERMOELECTRIC MATERIAL

[75] Inventors: Yoshikazu Yoshimoto; Eizo Ohno, both of Tenri; Masaru Yoshida, Ikoma; Shigeo Nakajima, Nara; Shoei Kataoka, Tanashi, all of Japan

[73] Assignee: Sharp Kabushiki Kaisha, Osaka, Japan

[21] Appl. No.: 908,919

[22] Filed: Jul. 2, 1992

Related U.S. Application Data

[60] Division of Ser. No. 698,484, Apr. 22, 1991, abandoned, which is a continuation-in-part of Ser. No. 433,413, Nov. 7, 1989, abandoned, which is a continuation of Ser. No. 192,683, May 10, 1988, abandoned.

[30] Foreign Application Priority Data

Jun. 26, 1987 [JP] Japan ................................. 62-160680

[51] Int. Cl.$^5$ .......................................... H01L 35/14
[52] U.S. Cl. ................................... 136/201; 136/203; 136/236.1; 136/239; 136/241
[58] Field of Search ............... 136/201, 203, 236.1, 136/239, 241

[56] References Cited

U.S. PATENT DOCUMENTS

| | | | |
|---|---|---|---|
| 1,120,781 | 12/1914 | Altenkirch et al. | 136/203 |
| 4,489,742 | 12/1984 | Moore et al. | 136/203 |
| 5,006,505 | 4/1991 | Skertie | 505/1 |

FOREIGN PATENT DOCUMENTS

| | | | |
|---|---|---|---|
| 730328 | 3/1966 | Canada | 136/203 |
| 2207321 | 1/1989 | United Kingdom | . |

OTHER PUBLICATIONS

Chu et al., "Evidence for Superconductivity above 40K in the La–Ba–Cu–O Compound System", *Physical Review Letters*, vol. 58, No. 4, Jan. 1987, pp. 405–407.

Cava et al., "Bulk Superconductivity at 36K in $La_{1.8}Sr_{0.2}CuO_4$", *Physical Review Letters*, vol. 58, No. 4, Jan. 1987, pp. 408–410.

Wu et al., "Superconductivity at 93K in a New Mixed-Phase Y–Ba–Cu–O Compound System at Ambient Pressure", *Physical Review Ltrs.*, vol. 58, No. 9, Mar. 1987 pp. 908–910.

Choi et al, "Electronic-transport behavior . . . ," *Physical Review D/Condensed Matter*, 34 (1986) 15 Nov., No. 10, pp. 6972–6979.

Goldsmid et al, "High-$T_C$ superconductors . . . ," *J. of Physics D/Applied Physics*, 21 (1988) 14 Feb., No. 2, pp. 344–343.

Maeno et al, *Japanese J. of Appl. Physics*, vol. 26, No. 4, Apr. 1987, pp. L402–L404.

Cooper et al, *Physical Review B*, vol. 35, No. 16, Jun. 1, 1987, pp. 8794–8796.

Kawai et al, "Preparation of High-$T_C$ . . . ," *Jap. J. App. Phys.*, vol. 26, No. 5, May 1987, pp. L736–L737.

Wu et al, "Superconductivity at . . . ," *Phs. Rev. Lett.*, No. 9, Mar. 2, 1987, pp. 908–909.

Takekawa et al, "Single-Crystal Preparation . . . ," *Jap. J. App. Phy.*, vol. 26, No. 5, May 1987, pp. L851–L853.

Syono et al, "X-ray and Electron Microscopic . . . ," *Jap. J. App. Phys.*, vol. 26, No. 4, Apr. 1987, pp. L498–L501.

Laurent et al, "Thermoelectric Power and . . . ," *Solid State Comm.*, vol. 66, No. 4, 1988, pp. 445–450.

*Primary Examiner*—Donald P. Walsh
*Assistant Examiner*—Chrisman D. Carroll
*Attorney, Agent, or Firm*—Birch, Stewart, Kolasch & Birch

[57] ABSTRACT

A thermoelectric material is provided which consists of an oxide with a perovskite structure, wherein the oxide is of the formula $(Ln_{1-x}A_x)_2MO_4$ with $0.01 \leq x \leq 0.05$, where Ln is a rare earth element, A is an alkali earth metal element, and M is a transition metal element. The thermoelectric material is particularly useful for Peltier cooling elements to produce low temperatures below room temperature.

15 Claims, 3 Drawing Sheets

THERMOELECTRIC MATERIAL

This application is a divisional of Ser. No. 07/698,484, filed on Apr. 22, 1991, now abandoned, which is a continuation-in-part of application Ser. No. 07/433,413 filed on Nov. 7, 1989, now abandoned which is a continuation application of Ser. No. 07/192,683 filed on May 10, 1988, which is abandoned. The entire contents of which are hereby incorporated by reference.

BACKGROUND OF THE INVENTION

1. Field of the Invention

This invention relates to a thermoelectric material for generating electrical energy by the use of temperature differences (based on the Seebeck effect) or for generating temperature differences from electrical energy (based on the Peltier effect). More particularly, it relates to a thermoelectric material consisting of an oxide with a perovskite structure, wherein the oxide is composed of a rare earth element, an alkali earth metal element, and a transition metal element. The thermoelectric material of this invention exhibits larger thermoelectric power at low temperatures below room temperature, as compared with conventional thermoelectric materials.

2. Description of the Prior Art

As is well known in the art, the thermoelectrical property, which is expressed by the efficiency of conversion between thermal energy and electrical energy, can be evaluated in terms of a thermoelectric figure of merit Z. The value of Z can be estimated by the equation $Z = \alpha^2 \lambda / k$. Here, $\alpha$ is the thermoelectric power ($\mu \cdot V \cdot K^{-1}$), $\lambda$ is the electrical conductivity ($\Omega^{-1} cm^{-1}$), and k is the thermal conductivity ($W \cdot cm^{-1} K^{-1}$). As can be seen from the equation, a larger $\alpha$, a larger $\lambda$, and a smaller k are necessary to obtain a larger thermoelectric figure of merit Z.

However, it is well known that $\lambda / k$ for metals is expected to be a constant by the Wiedemann-Franz law, and that the three constants mentioned above are not necessarily independent of each other. This law is not always applicable to the case of semiconductor materials, and the selection of materials to produce a thermoelectric material is therefore relatively unrestricted. Moreover, the value of $\alpha$ obtained for metals is in the order of 10 $\mu \cdot V/K$, whereas a number of semiconductors have a higher value of $\alpha$ than that obtained for metals by one or more orders of magnitude.

Examples of typical thermoelectric materials that have been previously developed include polycrystalline silicides of transition metals used for thermoelectrical power generation, and chalcogenides of bismuth or antimony used for cooling based on the Peltier effect. Among them, $Bi_2Te_3$-type compounds have the most excellent thermoelectric figures of merit at temperatures around room temperature, and it is well known in the art that they have come into use as Peltier elements in electronic cooling apparatuses and the like.

However, this material exhibits a drastic decrease in the thermoelectric figure of merit at temperatures below room temperature, so that the cooling temperature is restricted at present only within an extremely narrow temperature range around room temperature. For this reason, it has been required to develop a thermoelectric material for cooling based on the Peltier effect, which has a large thermoelectric figure of merit over a wide range of temperatures below room temperature.

SUMMARY OF THE INVENTION

The thermoelectric material of this invention, which overcomes the above-discussed and numerous other disadvantages and deficiencies of the prior art, consists of an oxide with a perovskite structure, wherein the oxide is of the formula $(Ln_{1-x}A_x)_2MO_4$ with $0.01 \leq x \leq 0.05$, where Ln is a rare earth element, A is as alkaline earth metal element, and M is a transition metal element.

In a preferred embodiment of the present invention, the above-mentioned rare earth element is selected from the group consisting of yttrium (Y), lanthanum (La), dysprosium (Dy), ytterbium (Yb), and samarium (Sm).

In a preferred embodiment of the present invention, the above-mentioned alkaline earth metal element is selected from the group consisting of calcium (Ca), strontium (Sr), and barium (Ba).

In a preferred embodiment of the present invention, the above-mentioned transition metal element is selected from the group consisting of copper (Cu), titanium (Ti), iron (Fe), nickel (Ni), zinc (Zn), cobalt (Co), and manganese (Mn).

In a preferred embodiment of the present invention, the above-mentioned oxide is of the formula $(La_{1-x}Ba_x)_2CuO_4$ with $0.01 \leq x \leq 0.05$.

In a preferred embodiment of the present invention, the above-mentioned oxide is of the formula $(La_{1-x}Sr_x)_2CuO_4$ with $0.01 \leq x \leq 0.05$.

In a preferred embodiment of the present invention, the above-mentioned oxide is of the formula $(Y_{1-x}Ba_x)_2CuO_4$ with $0.01 \leq x \leq 0.05$.

In a preferred embodiment of the present invention, the above-mentioned thermoelectric material has a thermoelectric figure of $2.5 \times 10^{-3}$ to $4.6 \times 10^{-3}$ $K^{-1}$ at temperatures ranging from 100 K to room temperature.

Thus, the invention described herein makes possible the objectives of (1) providing a thermoelectric material having a large thermoelectric figure of merit from room temperature to 100 K or less; (2) providing a thermoelectric material having excellent temperature characteristics which do not deteriorate down to a temperature lower than 100 K, thereby obtaining a Peltier cooling element with which cooling temperatures below room temperature can be attained; and (3) providing a thermoelectric material which is excellent in that it can readily be produced at low cost and the type of its thermoelectric power can readily be controlled, either F-type or N-type, thereby obtaining a Peltier cooling element with high performance having a wide range of applications.

BRIEF DESCRIPTION OF THE DRAWING

This invention may be better understood and its numerous objectives and advantages will become apparent to those skilled in the art by reference to the accompanying drawing as follows.

DESCRIPTION OF THE PREFERRED EMBODIMENTS

The inventors devoted themselves to the study of thermoelectric materials available in place of conventional thermoelectric materials such as polycrystalline silicides of transition metals and chalcogenides of bismuth or antimony, and found that various oxides of the formula ($Ln_{1-x}A_x$)$_2MO_4$, where Ln is a rare earth element, A is an alkaline earth metal element, and M is a transition metal element, exhibit excellent thermoelectric characteristics.

Particularly, in an evaluation of oxides in which lanthanum and yttrium are used as a rare earth element, copper as a transition metal element, and barium and strontium as an alkaline earth metal element, the following results were obtained. These oxides with a perovskite structure have large thermoelectric figures of merit over a wide temperature range from room temperature to 100 K or less, the values of which are greater than or equal to the largest value (i.e., $2.5 \times 10^{-3} K^{-1}$) known to date for thermoelectric materials of the Bi-Te type. Also, the temperature characteristics of the oxides do not deteriorate down to a temperature below 100 K.

The inventors' further researches were made to determine the preferred range of mole fraction x of alkaline earth metal elements in the formula described above. Various oxides were examined for their thermoelectric characteristics with an alternation in mole fraction x.

Figure 2:
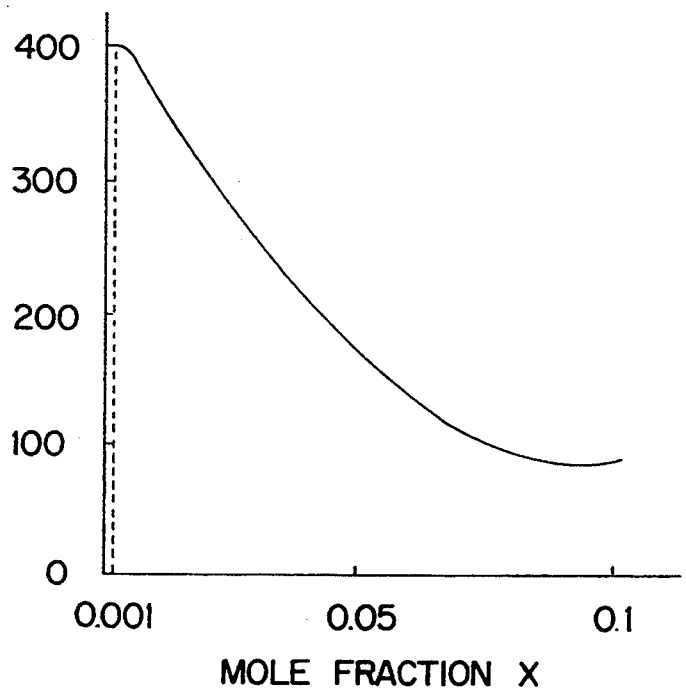
FIG. 2 is a graph showing the relationship between the thermoelectric power and the mole fraction of alkaline earth metal elements for the oxide with a perovskite (($La_{1-x}Sr_x$)$_2CuO_4$)) of this invention.
Figure 3:
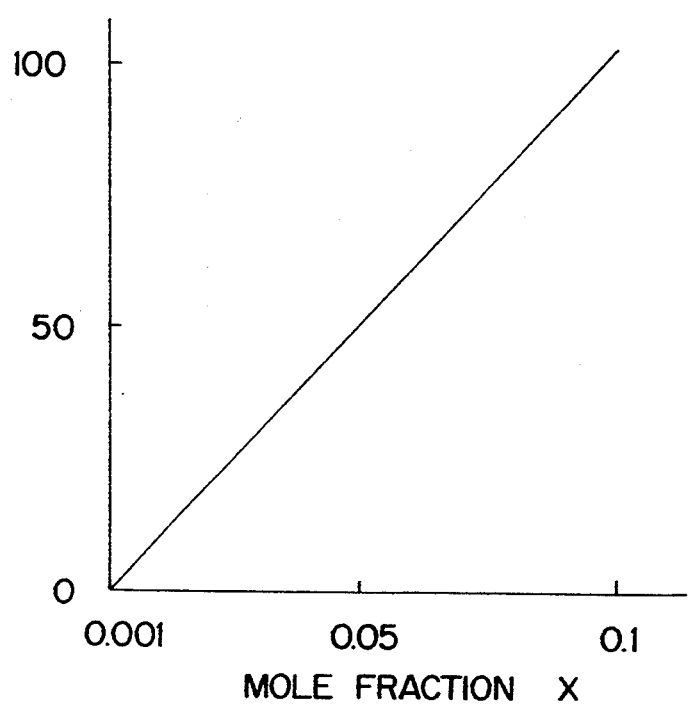
FIG. 3 is a graph showing the relationship between the electrical conductivity and the mole fraction of alkaline earth metal elements for the oxide with a perovskite (($La_{1-x}Sr_x$)$_2CuO_4$)) of this invention.
Figure 4:
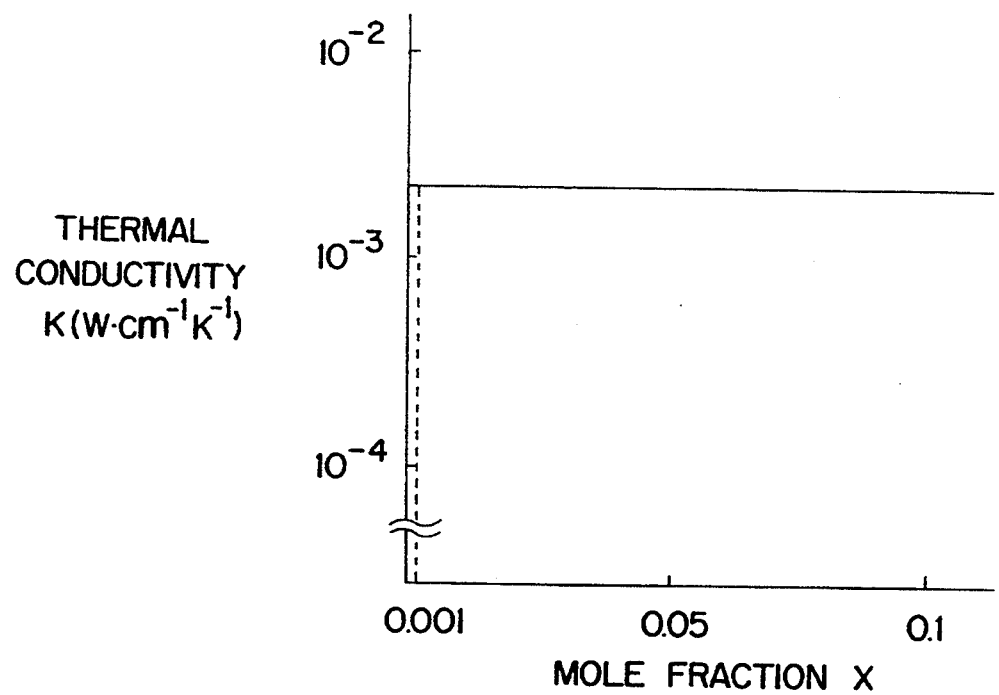
FIG. 4 is a graph showing the relationship between the thermal conductivity and the mole fraction of alkaline earth metal elements for the oxide with a perovskite (($La_{1-x}Sr_x$)$_2CuO_4$)) of this invention.

As a typical example, the mole fraction dependences of the thermoelectric power $\alpha$, electrical conductivity $\lambda$, and thermal conductivity k for the oxide of the formula ($La_{1-x}Sr_x$)$_2CuO_4$ are shown in FIGS. 2, 3, and 4, respectively. When mole fraction x is in the range of 0.001 to 0.07, the thermoelectric power $\alpha$ has a logarithmic decrease with an increase in the content of alkaline earth metal elements, while the electrical conductivity $\lambda$ has a linear increase with an increase in mole fraction x. In contrast, the thermal conductivity k has substantially no change.

Figure 5:
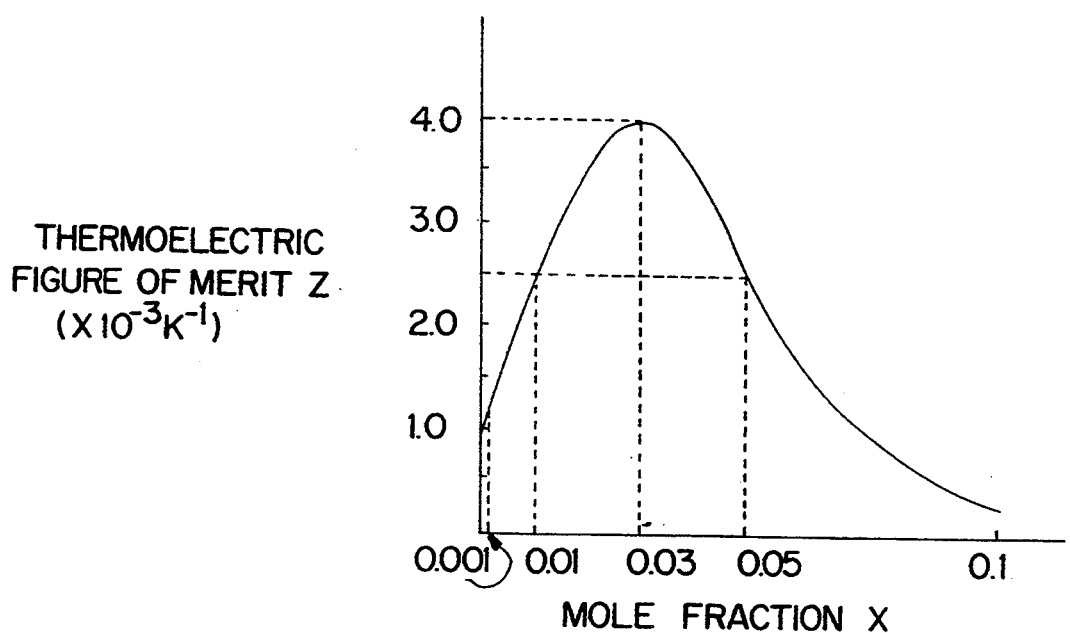
FIG. 5 is a graph showing the relationship between the thermoelectric figure of merit and the mole fraction of alkaline earth metal elements for the oxide with a perovskite (($La_{1-x}Sr_x$)$_2CuO_4$)) of this invention.

From the data shown in FIGS. 2, 3, and 4, the thermoelectric figure of merit Z was calculated by the equation $Z=\alpha^2\lambda/k$. The results are plotted as a function of mole fraction x in FIG. 5. As can be seen from this figure, the thermoelectric figure of merit Z has a maximum value at a mole fraction of 0.03, and the oxide of the formula ($La_{1-x}Sr_x$)$_2CuO_4$ exhibits greater thermoelectric figure of merit than that of conventional thermoelectric materials in the mole fraction range of 0.01 to 0.05. Moreover, when the mole fraction is greater than or equal to 0.07, the above-described oxide falls under the category of superconductive materials because of its high electrical conductivity; however, it cannot be used as a thermoelectric material because of its low thermoelectric figure of merit.

Although these thermoelectric characteristics were found in the oxide of the formula ($La_{1-x}Sr_x$)$_2CuO_4$, similar characteristics were also found in other oxides of the formula ($Ln_{1-x}A_x$)$_2MO_4$, where Ln is a rare earth element, A is an alkaline earth metal element, and M is a transition metal element.

Thus, it was revealed that the thermoelectric material of this invention, which is made of an oxide of the formula ($Ln_{1-x}A_x$)$_2MO_4$ with $0.01 \leq x \leq 0.05$, where Ln is a rare earth element, A is an alkaline earth metal element, and M is a transition metal element, exhibits excellent thermoelectric characteristics, as compared with the conventional thermoelectric materials.

The oxide of this invention can be prepared by any of the techniques such as sputtering, coprecipitation, fusion, and powder sintering. The powder sintering technique is used herein as an example, but the structure and characteristics of the oxides of this invention are not limited to a particular technique used for the preparation.

EXAMPLE 1

First, 2.272 g of lanthanum oxide ($La_2O_3$), 0.1794 g of barium carbonate ($BaCO_3$), and 1.4466 g of cupric oxide (CuO) were mixed together well in a mortar. The mixture was sintered at 900° C. for 12 hours. The resulting product was then ground into a powder and mixed well, followed by further sintering at 1100° C. for about 5 hours. The oxide thus obtained as a thermoelectric material was examined for its composition and found to have a composition of ($La_{1-x}Ba_x$)$_2CuO_4$ with x=0.025. Moreover, the oxide was analyzed for its structure by X-ray diffraction and found to have a perovskite structure.

Next, the thermoelectric material obtained in this way was evaluated in terms of its thermoelectric figure of merit Z ($Z=\alpha^2\lambda/k$), which was calculated from its thermoelectric power $\alpha$, electrical conductivity $\lambda$, and thermal conductivity k at temperatures from 100 K. to room temperature. These results are shown in Table 1 below. The type of thermoelectric power changes depending on the mole fraction x of alkaline earth metal elements and the amount of oxygen. The thermoelectric material of this example was of the P-type.

TABLE 1

| Thermoelectrical properties of ($La_{1-x}Ba_x$)$_2CuO_4$ with x = 0.025 | | | |
|---|---|---|---|
| | Temperature (K.) | | |
| | 100 | 200 | 300 |
| Thermoelectric power $\alpha$ ($\mu \cdot V \cdot K^{-1}$) | 450 | 440 | 430 |
| Thermal conductivity k ($W \cdot cm^{-1}K^{-1}$) | $8 \times 10^{-3}$ | $7 \times 10^{-3}$ | $6 \times 10^{-3}$ |
| Electrical conductivity $\lambda$ ($\Omega^{-1}cm^{-1}$) | 100 | 105 | 110 |
| Thermoelectric figure of merit Z ($\times 10^{-3}K^{-1}$) | 2.5 | 2.9 | 3.4 |

Figure 1:
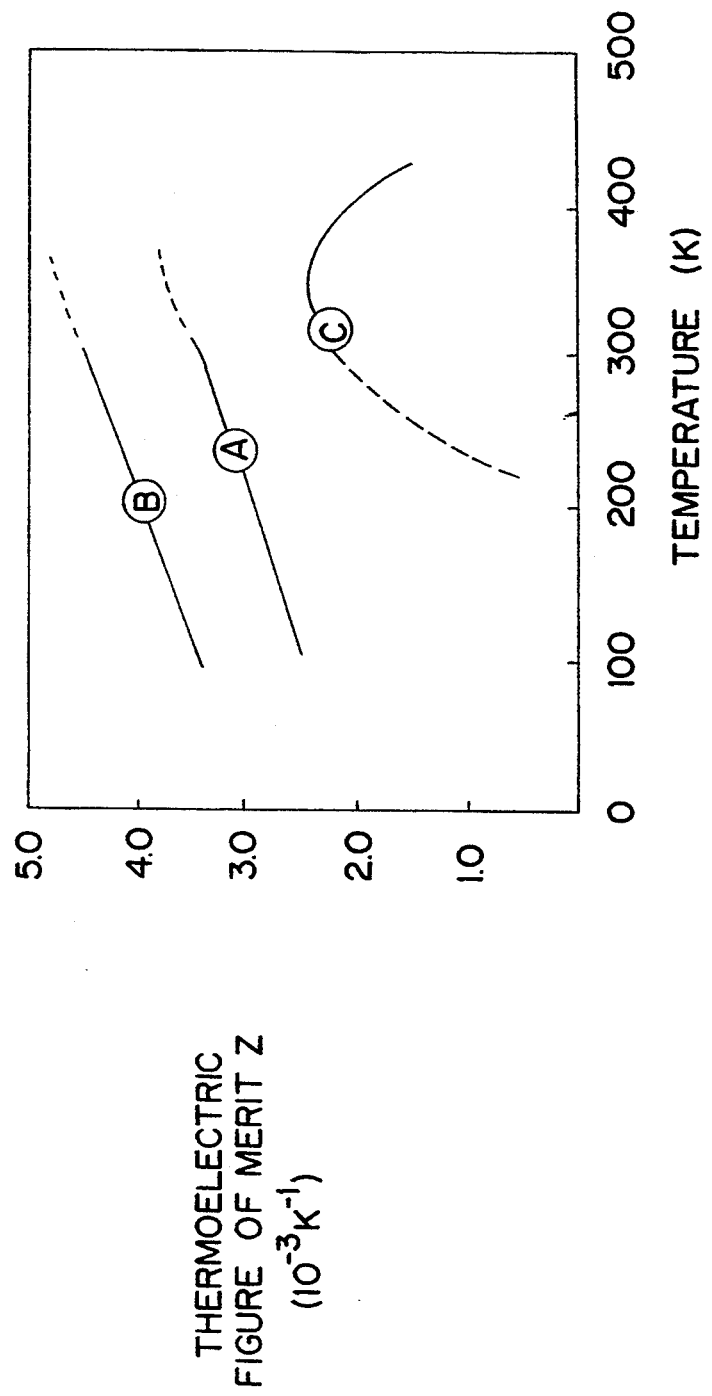
FIG. 1 is a graph showing the temperature dependences of the thermoelectric figures of merit for the oxides with a perovskite structure (i.e., $(La_{1-x}Ba_x)_2CuO_4$ and $(La_{1-x}Sr_x)_2CuO_4$) of this invention and for the conventional thermoelectric material of the Bi-Te type.

The temperature characteristics of the thermoelectric figures of merit for the oxides of this invention and for the conventional thermoelectric material of the Bi-Te type are also compared in FIG. 1. Curves A and B in FIG. 1 are the characteristic curves for the thermoelectric materials of this invention, that is, ($La_{1-x}Ba_x$)$_2CuO_4$ with x=0.025 and ($La_{1-x}Sr_x$)$_2CuO_4$ with x=0.03, respectively. These materials are of the P-type, and the latter material is fully described in the following Example 2. Curve C in FIG. 1 also shows the characteristic curve for the conventional thermoelectric material of the Bi-Te type. As is clear from Curves A and C in FIG. 1, the thermoelectric figure of merit for the oxide of this example is greater than the value for the material of the Bi-Te type at temperatures around room temperature, and deteriorates only slightly at lower temperatures, even at 100 K.

EXAMPLE 2

First, 2.850 g of lanthanum oxide ($La_2O_3$), 0.203 g of strontium carbonate ($SrCO_3$), and 1.640 g of cuprous oxide ($Cu_2O$) were mixed together well in a mortar. The mixture was sintered at 900° C. for 12 hours. The resulting product was ground into a powder and again mixed well, followed by further sintering at 1100° C. for about 5 hours. The oxide thus obtained as a thermoelectric material was examined for its composition and found to have a composition of $(La_{1-x}Sr_x)_2CuO_4$ with x=0.03. Moreover, the oxide was analyzed for its structure by X-ray diffraction and found to have a perovskite structure.

In addition, the thermoelectric material of this example was examined for its thermoelectric power, thermal conductivity, electrical conductivity, and thermoelectric figure of merit at temperatures from 100 K. to room temperature. The results are shown in Table 2. As can be seen from Table 2, even at the low temperature of 100 K., the thermoelectric figure of merit was still high and had a value of $3.4 \times 10^{-3}$ $K^{-1}$. Furthermore, the comparison of Curves B and C in FIG. 1 shows that the thermoelectric material of this example also has more excellent temperature characteristics then those of the conventional thermoelectric material of the Bi-Te type.

TABLE 2

| Thermoelectrical properties of $(La_{1-x}Sr_x)_2CuO_4$ with x = 0.03 | | | |
|---|---|---|---|
| | Temperature (K.) | | |
| | 100 | 200 | 300 |
| Thermoelectric power α ($\mu \cdot V \cdot K^{-1}$) | 400 | 390 | 380 |
| Thermal conductivity k ($W \cdot cm^{-1}K^{-1}$) | $4.0 \times 10^{-3}$ | $3.5 \times 10^{-3}$ | $3.0 \times 10^{-3}$ |
| Electrical conductivity λ ($\Omega^{-1}cm^{-1}$) | 85 | 90 | 95 |
| Thermoelectric figure of merit Z ($\times 10^{-3}K^{-1}$) | 3.4 | 3.9 | 4.6 |

EXAMPLE 3

First, 2.941 g of yttrium oxide ($Y_2O_3$), 0.1050 g of barium carbonate ($BaCO_3$), and 1.057 g of cupric oxide (CuO) were mixed together in the same manner as in Examples 1 and 2. The mixture was then sintered at 700° C. for 12 hours, and then further sintered at 900° C. in an atmosphere with an excess of oxygen for about 6 hours. The oxide thus obtained as a thermoelectric material was examined for its composition and found to have a composition of $(Y_{1-x}Ba_x)_2CuO_4$ with x=0.02. Moreover, the oxide had the same structure as that obtained in Examples 1 and 2, except that the thermoelectric power was of the N-type. The thermoelectric figure of merit was $3.0 \times 10^{-3}$ $K^{-1}$ at 100 K., and its variation with temperature was the same as that shown in Examples 1 and 2.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for generating electrical energy comprising: applying a temperature differential to thermoelectric elements, which comprise a P element and an N element, such that electrical energy is generated by the Seebeck effect wherein at least one of said P element and said N element comprises a thermoelectric material consisting of an oxide with a perovskite structure, wherein said oxide is of the formula $(Ln_{1-x}A_x)_2MO_4$ with $0.01 \leq x < 0.05$, where Ln is a rare earth element, A is an alkaline earth metal element, and M is a transition metal element, said thermoelectric material having a thermoelectric figure of merit Z of $2.5 \times 10^{-3}$ to $4.6 \times 10^{-3}K^{-1}$ at temperatures ranging from 100K. to room temperature.

2. A method for generating electrical energy according to claim 1, wherein said rare earth element is selected from the group consisting of dysprosium (Dy), ytterbium (Yb), and samarium (Sm).

3. A method for generating electrical energy according to claim 1, wherein said alkaline earth metal element is selected from the group consisting of calcium (Ca).

4. A method for generating electrical energy according to claim 1, wherein said transition metal element is selected from the group consisting of zinc (Zn), cobalt (Co), and manganese (Mn).

5. A method for generating electrical energy according to claim 1, wherein said oxide is of the formula $(La_{1-x}Ba_x)_2CuO_4$ with $0.01 \leq x < 0.05$.

6. A method for generating electrical energy according to claim 1, wherein said oxide is of the formula $(La_{1-x}Sr_x)_2CuO_4$ with $0.01 \leq x < 0.05$.

7. A method for generating electrical energy according to claim 1, wherein said oxide is of the formula $(Y_{1-x}Ba_x)_2CuO_4$ with $0.01 \leq x < 0.05$.

8. A method for generating temperature differences comprising: applying electrical energy to thermoelectric elements, which comprise a P element and an N element, such that a temperature difference is generated by the Peltier effect, wherein at least one of said P element and said N element comprises a thermoelectric material consisting of an oxide with an perovskite structure, wherein said oxide is of the formula $(Ln_{1-x}A_x)_2MO_4$ with, $0.01 \leq x < 0.05$ where Ln is a rare earth element, A is an alkaline earth metal element, and M is a transition metal element, said thermoelectric material having a thermoelectric figure of merit Z of $2.5 \times 10^{-3}$ to $4.6 \times 10^{-3}K^{-1}$ at temperatures ranging from 100K. to room temperature.

9. A method for generating temperature differences according to claim 8, wherein said rare earth element is selected from the group consisting of dysprosium (Dy), ytterbium (Yb), and samarium (Sm).

10. A method for generating temperature differences according to claim 8, wherein said alkaline earth metal element is selected from the group consisting of calcium (Ca).

11. A method for generating temperature differences according to claim 8, wherein said transition metal element is selected from the group consisting of zinc (Zn), cobalt (Co), and manganese (Mn).

12. A method for generating temperature differences according to claim 8, wherein said oxide is of the formula $(La_{1-x}Ba_x)_2CuO_4$ with $0.01 \leq x < 0.05$.

13. A method for generating temperature differences according to claim 8, wherein said oxide is of the formula $(La_{1-x}Sr_x)_2CuO_4$ with $0.01 \leq x < 0.05$.

14. A method for generating temperature differences according to claim 8, wherein said oxide is of the formula $(Y_{1-x}Ba_x)_2CuO_4$ with $0.01 \leq x < 0.05$.

15. A method for generating temperature differences which comprises applying electrical energy to an electronic cooling apparatus and thereby inducing the peltier effect and causing a temperature differential, wherein said electronic cooling apparatus contains a thermoelectric material that consists of an oxide having a perovskite structure of the formula $(Ln_{1-x}A_x)_2MO_4$ with $0.01 \leq x < 0.05$, where Ln is a rare earth element, A is an alkaline earth metal element, and M is a transition metal element, said thermoelectric material having a thermoelectric figure of merit Z of $2.5 \times 10^{-3}$ to $4.6 \times 10^{-3} K^{-1}$ at temperatures ranging from 100K. to room temperature.

* * * * *